United States Patent
Chang et al.

(10) Patent No.: US 8,399,922 B2
(45) Date of Patent: Mar. 19, 2013

(54) INDEPENDENTLY ACCESSED DOUBLE-GATE AND TRI-GATE TRANSISTORS

(75) Inventors: Peter L. D. Chang, Portland, OR (US); Brian S. Doyle, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/620,282

(22) Filed: Sep. 14, 2012

(65) Prior Publication Data

US 2013/0009248 A1   Jan. 10, 2013

Related U.S. Application Data (60) Continuation of application No. 12/852,408, filed on Aug. 6, 2010, now Pat. No. 8,268,709, which is a continuation of application No. 11/335,103, filed on Jan. 18, 2006, now Pat. No. 7,859,053, which is a division of application No. 11/124,572, filed on May 4, 2005, now Pat. No. 7,037,790, which is a continuation-in-part of application No. 10/955,670, filed on Sep. 29, 2004, now Pat. No. 7,422,946.

(51) Int. Cl.
*H01L 29/76* (2006.01)

(52) U.S. Cl. ...................... 257/331; 438/275

(58) Field of Classification Search .............. 257/338, 257/347, 331, 270, 287; 438/221
See application file for complete search history.

(56) References Cited

U.S. PATENT DOCUMENTS

| | | | |
|---|---|---|---|
| 3,387,820 A | 6/1968 | Sanderfer et al. | |
| 4,231,149 A | 11/1980 | Chapman et al. | |
| 4,487,652 A | 12/1984 | Almgren | |
| 4,711,701 A | 12/1987 | McLevige | |
| 4,818,715 A | 4/1989 | Chao | |
| 4,905,063 A | 2/1990 | Beltram et al. | |
| 4,906,589 A | 3/1990 | Chao | |
| 4,907,048 A | 3/1990 | Huang | |
| 4,994,873 A | 2/1991 | Madan | |
| 4,996,574 A | 2/1991 | Shirasaki | |
| 5,023,203 A | 6/1991 | Choi | |
| 5,120,666 A | 6/1992 | Gotou | |
| 5,124,777 A | 6/1992 | Lee | |
| 5,179,037 A | 1/1993 | Seabaugh | |
| 5,216,271 A | 6/1993 | Takagi et al. | |
| 5,218,213 A | 6/1993 | Gaul et al. | |
| 5,278,012 A | 1/1994 | Yamanaka et al. | |
| 5,308,999 A | 5/1994 | Gotou | |
| 5,328,810 A | 7/1994 | Lowrey et al. | |

(Continued)

FOREIGN PATENT DOCUMENTS

DE  102 03 998 A1  8/2003
EP  0 623 963 A1  11/1994

(Continued)

OTHER PUBLICATIONS

Auth et al., "Vertical, Fully-Depleted, Surroundings Gate MOSFETS on sub-0.1um Thick Silicon Pillars", 1996 54th Annual Device Research Conference Digest, pp. 108-109 (1996).

(Continued)

*Primary Examiner* — Thao P. Le
(74) *Attorney, Agent, or Firm* — Blakely, Sokoloff, Taylor & Zafman LLP (57) ABSTRACT

A method for fabricating double-gate and tri-gate transistors in the same process flow is described. In one embodiment, a sacrificial layer is formed over stacks that include semiconductor bodies and insulative members. The sacrificial layer is planarized prior to forming gate-defining members. After forming the gate-defining members, remaining insulative member portions are removed from above the semiconductor body of the tri-gate device but not the I-gate device. This facilitates the formation of metallization on three sides of the tri-gate device, and the formation of independent gates for the I-gate device.

6 Claims, 8 Drawing Sheets

U.S. PATENT DOCUMENTS

| | | | |
|---|---|---|---|
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,391,506 A | 2/1995 | Tada et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,497,019 A * | 3/1996 | Mayer et al. | 257/347 |
| 5,514,885 A | 5/1996 | Myrick | |
| 5,521,859 A | 5/1996 | Ema et al. | |
| 5,539,229 A | 7/1996 | Noble, Jr et al. | |
| 5,543,351 A | 8/1996 | Hirai et al. | |
| 5,545,586 A | 8/1996 | Koh | |
| 5,563,077 A | 10/1996 | Ha | |
| 5,576,227 A | 11/1996 | Hsu | |
| 5,578,513 A | 11/1996 | Maegawa | |
| 5,595,919 A | 1/1997 | Pan | |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,698,869 A | 12/1997 | Yoshimi et al. | |
| 5,701,016 A | 12/1997 | Burroughes et al. | |
| 5,716,879 A | 2/1998 | Choi et al. | |
| 5,739,544 A | 4/1998 | Yuki et al. | |
| 5,760,442 A | 6/1998 | Shigyo et al. | |
| 5,770,513 A | 6/1998 | Okaniwa | |
| 5,773,331 A | 6/1998 | Solomon et al. | |
| 5,776,821 A | 7/1998 | Haskell et al. | |
| 5,793,088 A | 8/1998 | Choi et al. | |
| 5,804,848 A * | 9/1998 | Mukai | 257/270 |
| 5,811,324 A | 9/1998 | Yang | |
| 5,814,895 A | 9/1998 | Hirayama | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,856,225 A | 1/1999 | Lee et al. | |
| 5,880,015 A | 3/1999 | Hata | |
| 5,888,309 A | 3/1999 | Yu | |
| 5,889,304 A | 3/1999 | Watanabe et al. | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea et al. | |
| 5,965,914 A | 10/1999 | Miyamoto | |
| 5,976,767 A | 11/1999 | Li | |
| 5,985,726 A | 11/1999 | Yu et al. | |
| 6,013,926 A | 1/2000 | Oku et al. | |
| 6,018,176 A | 1/2000 | Lim | |
| 6,031,249 A | 2/2000 | Yamazaki et al. | |
| 6,051,452 A | 4/2000 | Shigyo et al. | |
| 6,054,355 A | 4/2000 | Inumiya et al. | |
| 6,063,675 A | 5/2000 | Rodder | |
| 6,066,869 A | 5/2000 | Noble et al. | |
| 6,087,208 A | 7/2000 | Krivokapic et al. | |
| 6,093,621 A | 7/2000 | Tseng | |
| 6,114,201 A | 9/2000 | Wu | |
| 6,114,206 A | 9/2000 | Yu | |
| 6,117,741 A | 9/2000 | Chatterjee et al. | |
| 6,120,846 A | 9/2000 | Hintermaier et al. | |
| 6,130,123 A | 10/2000 | Liang et al. | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,159,808 A | 12/2000 | Chuang | |
| 6,163,053 A | 12/2000 | Kawashima | |
| 6,165,880 A | 12/2000 | Yaung et al. | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,218,309 B1 | 4/2001 | Miller et al. | |
| 6,251,729 B1 | 6/2001 | Montree et al. | |
| 6,251,751 B1 | 6/2001 | Chu et al. | |
| 6,251,763 B1 | 6/2001 | Inumiya et al. | |
| 6,252,284 B1 | 6/2001 | Muller et al. | |
| 6,259,135 B1 | 7/2001 | Hsu et al. | |
| 6,261,921 B1 | 7/2001 | Yen et al. | |
| 6,262,456 B1 | 7/2001 | Yu et al. | |
| 6,274,503 B1 | 8/2001 | Hsieh | |
| 6,287,924 B1 | 9/2001 | Chao et al. | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,317,444 B1 | 11/2001 | Chakrabarti et al. | |
| 6,319,807 B1 | 11/2001 | Yeh et al. | |
| 6,335,251 B2 | 1/2002 | Miyano et al. | |
| 6,358,800 B1 | 3/2002 | Tseng | |
| 6,359,311 B1 | 3/2002 | Colinge et al. | |
| 6,362,111 B1 | 3/2002 | Laaksonen et al. | |
| 6,368,923 B1 | 4/2002 | Huang | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,407,442 B2 | 6/2002 | Inoue et al. | |
| 6,410,371 B1 | 6/2002 | Yu et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,457,890 B1 | 10/2002 | Kohlruss et al. | |
| 6,458,662 B1 | 10/2002 | Yu | |
| 6,459,123 B1 | 10/2002 | Enders et al. | |
| 6,465,290 B1 | 10/2002 | Suguro et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,479,866 B1 | 11/2002 | Xiang | |
| 6,483,146 B2 | 11/2002 | Lee et al. | |
| 6,483,151 B2 | 11/2002 | Wakabayashi et al. | |
| 6,483,156 B1 | 11/2002 | Adkisson et al. | |
| 6,495,403 B1 | 12/2002 | Skotnicki et al. | |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,515,339 B2 | 2/2003 | Shin et al. | |
| 6,525,403 B2 | 2/2003 | Inaba et al. | |
| 6,526,996 B1 | 3/2003 | Chang et al. | |
| 6,534,807 B2 | 3/2003 | Mandelman et al. | |
| 6,537,862 B2 | 3/2003 | Song | |
| 6,537,885 B1 | 3/2003 | Kang et al. | |
| 6,537,901 B2 | 3/2003 | Cha et al. | |
| 6,541,829 B2 | 4/2003 | Nishinohara et al. | |
| 6,555,879 B1 | 4/2003 | Krivokapic et al. | |
| 6,562,665 B1 | 5/2003 | Yu | |
| 6,562,687 B1 | 5/2003 | Deleonibus et al. | |
| 6,566,734 B2 | 5/2003 | Sugihara et al. | |
| 6,583,469 B1 | 6/2003 | Fried et al. | |
| 6,605,498 B1 | 8/2003 | Murthy et al. | |
| 6,610,576 B2 | 8/2003 | Nowak | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,642,114 B2 | 11/2003 | Nakamura | |
| 6,645,797 B1 | 11/2003 | Buynoski et al. | |
| 6,645,826 B2 | 11/2003 | Yamazaki et al. | |
| 6,645,861 B2 | 11/2003 | Cabral et al. | |
| 6,656,853 B2 | 12/2003 | Ito | |
| 6,657,259 B2 | 12/2003 | Fried et al. | |
| 6,660,598 B2 | 12/2003 | Hanafi et al. | |
| 6,664,160 B2 | 12/2003 | Park et al. | |
| 6,680,240 B1 | 1/2004 | Maszara | |
| 6,686,231 B1 | 2/2004 | Ahmed et al. | |
| 6,689,650 B2 | 2/2004 | Gambino et al. | |
| 6,693,324 B2 | 2/2004 | Maegawa et al. | |
| 6,696,366 B1 | 2/2004 | Flanner et al. | |
| 6,706,571 B1 | 3/2004 | Yu et al. | |
| 6,709,982 B1 | 3/2004 | Buynoski et al. | |
| 6,713,396 B2 | 3/2004 | Anthony | |

| Patent No. | Date | Inventor(s) |
|---|---|---|
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,406 B1 | 9/2004 | Hill et al. |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,831,310 B1 | 12/2004 | Matthew et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,588 B1 | 2/2005 | Liao et al. |
| 6,855,606 B2 | 2/2005 | Chen et al. |
| 6,855,990 B2 | 2/2005 | Hu et al. |
| 6,858,472 B2 | 2/2005 | Schoenfeld |
| 6,858,478 B2 | 2/2005 | Chau et al. |
| 6,864,519 B2 | 3/2005 | Yeo et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,881,635 B1 | 4/2005 | Chidambarrao et al. |
| 6,884,154 B2 | 4/2005 | Mizushima et al. |
| 6,885,055 B2 | 4/2005 | Lee |
| 6,888,199 B2 | 5/2005 | Nowak et al. |
| 6,890,811 B2 | 5/2005 | Hou et al. |
| 6,891,234 B1 | 5/2005 | Connelly et al. |
| 6,897,527 B2 | 5/2005 | Dakshina-Murthy et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2 | 6/2005 | Hareland et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,946,377 B2 | 9/2005 | Chambers |
| 6,955,969 B2 | 10/2005 | Djomehri et al. |
| 6,960,517 B2 | 11/2005 | Rios et al. |
| 6,967,351 B2 | 11/2005 | Fried et al. |
| 6,969,878 B2 | 11/2005 | Coronel et al. |
| 6,974,738 B2 | 12/2005 | Hareland |
| 6,975,014 B1 | 12/2005 | Krivokapic et al. |
| 6,977,415 B2 | 12/2005 | Matsuo |
| 6,998,301 B1 | 2/2006 | Yu et al. |
| 6,998,318 B2 | 2/2006 | Park |
| 7,018,551 B2 | 3/2006 | Beintner et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,045,451 B2 | 5/2006 | Shenai-Khatkhate |
| 7,049,654 B2 | 5/2006 | Chang |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,074,656 B2 | 7/2006 | Yeo et al. |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,891 B2 | 9/2006 | Visokay et al. |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,954 B2 | 10/2006 | Shimizu et al. |
| 7,119,402 B2 | 10/2006 | Kinoshita et al. |
| 7,122,463 B2 | 10/2006 | Ohuchi |
| 7,132,360 B2 | 11/2006 | Schaeffer et al. |
| 7,138,320 B2 | 11/2006 | van Bentum et al. |
| 7,141,480 B2 | 11/2006 | Adam et al. |
| 7,141,856 B2 | 11/2006 | Lee et al. |
| 7,154,118 B2 | 12/2006 | Lindert et al. |
| 7,163,851 B2 | 1/2007 | Abadeer et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,196,372 B1 | 3/2007 | Yu et al. |
| 7,238,564 B2 | 7/2007 | Ko et al. |
| 7,241,653 B2 | 7/2007 | Hareland et al. |
| 7,247,547 B2 | 7/2007 | Zhu et al. |
| 7,247,578 B2 | 7/2007 | Brask |
| 7,250,645 B1 | 7/2007 | Wang et al. |
| 7,250,655 B2 | 7/2007 | Bae et al. |
| 7,256,455 B2 | 8/2007 | Ahmed et al. |
| 7,268,024 B2 | 9/2007 | Yeo et al. |
| 7,268,058 B2 | 9/2007 | Chau et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,326,634 B2 | 2/2008 | Lindert et al. |
| 7,329,913 B2 | 2/2008 | Brask et al. |
| 7,332,774 B2 * | 2/2008 | Cho et al. ............... 257/338 |
| 7,348,284 B2 | 3/2008 | Doyle et al. |
| 7,354,817 B2 | 4/2008 | Watanabe et al. |
| 7,358,121 B2 | 4/2008 | Chau et al. |
| 7,385,262 B2 | 6/2008 | O'Keeffe et al. |
| 7,396,730 B2 | 7/2008 | Li |
| 7,569,876 B2 * | 8/2009 | Forbes ............... 257/288 |
| 7,898,041 B2 * | 3/2011 | Radosavljevic et al. ...... 257/401 |
| 8,080,838 B2 * | 12/2011 | Chang et al. ............ 257/288 |
| 8,222,680 B2 * | 7/2012 | Lin et al. ............... 257/288 |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Leong et al. |

| | | |
|---|---|---|
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0186167 A1 | 10/2003 | Johnson, Jr. et al. |
| 2003/0190766 A1 | 10/2003 | Gonzalez et al. |
| 2003/0201458 A1 | 10/2003 | Clark et al. |
| 2003/0227036 A1 | 12/2003 | Sugiyama et al. |
| 2004/0016968 A1 | 1/2004 | Coronel et al. |
| 2004/0029323 A1 | 2/2004 | Shimizu et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris et al. |
| 2004/0132567 A1 | 7/2004 | Schonnenbeck |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0173815 A1 | 9/2004 | Yeo et al. |
| 2004/0173846 A1 | 9/2004 | Hergenrother et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0253792 A1 | 12/2004 | Cohen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0017377 A1 | 1/2005 | Joshi et al. |
| 2005/0019993 A1 | 1/2005 | Lee et al. |
| 2005/0020020 A1 | 1/2005 | Collaert et al. |
| 2005/0035391 A1 | 2/2005 | Lee et al. |
| 2005/0035415 A1 | 2/2005 | Yeo et al. |
| 2005/0040444 A1 | 2/2005 | Cohen |
| 2005/0059214 A1 | 3/2005 | Cheng et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0104096 A1 | 5/2005 | Lee et al. |
| 2005/0110082 A1 | 5/2005 | Cheng et al. |
| 2005/0118790 A1 | 6/2005 | Lee et al. |
| 2005/0127362 A1 | 6/2005 | Zhang et al. |
| 2005/0127632 A1 | 6/2005 | Gehre |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0167766 A1 | 8/2005 | Yagishita |
| 2005/0170593 A1 | 8/2005 | Kang et al. |
| 2005/0184316 A1 | 8/2005 | Kim et al. |
| 2005/0189583 A1 | 9/2005 | Kim et al. |
| 2005/0191795 A1 | 9/2005 | Chidambarrao et al. |
| 2005/0199919 A1 | 9/2005 | Liu et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224798 A1 | 10/2005 | Buss |
| 2005/0224800 A1 | 10/2005 | Lindert et al. |
| 2005/0227498 A1 | 10/2005 | Furukawa et al. |
| 2005/0230763 A1 | 10/2005 | Huang et al. |
| 2005/0233156 A1 | 10/2005 | Senzaki et al. |
| 2005/0239252 A1 | 10/2005 | Ahn et al. |
| 2005/0255642 A1 | 11/2005 | Liu et al. |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1 | 12/2005 | Doris et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |
| 2006/0063469 A1 | 3/2006 | Talieh et al. |
| 2006/0068590 A1 | 3/2006 | Lindert et al. |
| 2006/0068591 A1 | 3/2006 | Radosavljevic et al. |
| 2006/0071299 A1 | 4/2006 | Doyle et al. |
| 2006/0086977 A1 | 4/2006 | Shah et al. |
| 2006/0138548 A1 | 6/2006 | Richards et al. |
| 2006/0154478 A1 | 7/2006 | Hsu et al. |
| 2006/0170053 A1* | 8/2006 | Yeo et al. .................. 257/353 |
| 2006/0172480 A1 | 8/2006 | Wang et al. |
| 2006/0202270 A1 | 9/2006 | Son et al. |
| 2006/0205164 A1 | 9/2006 | Ko et al. |
| 2006/0211184 A1 | 9/2006 | Boyd et al. |
| 2006/0227595 A1 | 10/2006 | Chuang et al. |
| 2006/0240622 A1 | 10/2006 | Lee et al. |
| 2006/0263699 A1 | 11/2006 | Abatchev et al. |
| 2006/0281325 A1 | 12/2006 | Chou et al. |
| 2007/0001219 A1 | 1/2007 | Radosavljevic et al. |
| 2007/0023795 A1 | 2/2007 | Nagano et al. |
| 2007/0045748 A1 | 3/2007 | Booth et al. |
| 2007/0048930 A1 | 3/2007 | Figura et al. |
| 2007/0093010 A1 | 4/2007 | Mathew et al. |
| 2007/0108514 A1 | 5/2007 | Inoue et al. |
| 2007/0241414 A1 | 10/2007 | Narihiro |
| 2007/0262389 A1 | 11/2007 | Chau et al. |
| 2009/0072279 A1* | 3/2009 | Moselund et al. ............ 257/288 |
| 2011/0291192 A1* | 12/2011 | Pillarisetty et al. ............ 257/347 |
| 2012/0032265 A1* | 2/2012 | Simonelli et al. ............ 257/365 |

FOREIGN PATENT DOCUMENTS

| | | |
|---|---|---|
| EP | 1 091 413 A2 | 4/2001 |
| EP | 1 202 335 A2 | 5/2002 |
| EP | 1 566 844 A2 | 8/2005 |
| GB | 2 156 149 A | 10/1985 |
| JP | 56073454 A | 6/1981 |
| JP | 59145538 A | 8/1984 |
| JP | 02 303048 A | 12/1990 |
| JP | 0600 5856 | 1/1994 |

| | | |
|---|---|---|
| JP | 06-151387 A | 5/1994 |
| JP | 06 177089 A | 6/1994 |
| JP | 06224440 A | 8/1994 |
| JP | 7-50421 A | 2/1995 |
| JP | 09-162301 A | 6/1997 |
| JP | 2000 037842 A | 2/2000 |
| JP | 2001 338987 | 12/2001 |
| JP | 2002-110977 A | 12/2002 |
| JP | 2003-298051 | 10/2003 |
| KR | 10 0222363 | 10/1999 |
| TW | 2004 14538 | 8/1992 |
| TW | 2005 18310 | 11/1998 |
| TW | 508669 | 11/2002 |
| TW | 516232 | 1/2003 |
| TW | 561530 | 1/2003 |
| TW | 546713 | 8/2003 |
| TW | 548799 | 8/2003 |
| TW | 2004 02872 | 2/2004 |
| TW | 2004 05408 | 4/2004 |
| TW | 591798 | 6/2004 |
| TW | 594990 | 6/2004 |
| TW | 2004 14539 | 8/2004 |
| TW | 2004 17034 | 9/2004 |
| TW | I223449 | 11/2004 |
| TW | I231994 | 5/2005 |
| TW | I238524 | 8/2005 |
| TW | I239102 | 9/2005 |
| WO | WO 02/43151 A1 | 5/2002 |
| WO | WO 02/095814 | 11/2002 |
| WO | WO 03/003442 | 1/2003 |
| WO | WO 2006/007350 A1 | 1/2003 |
| WO | WO 2004/059726 A1 | 7/2004 |
| WO | WO 2005/034212 A2 | 4/2005 |
| WO | WO 2005/036651 A1 | 4/2005 |
| WO | WO 2005/098963 A1 | 10/2005 |
| WO | WO 2006/078469 A1 | 7/2006 |
| WO | WO 2007/002426 A2 | 1/2007 |
| WO | WO 2007/041152 A1 | 4/2007 |

OTHER PUBLICATIONS

Breed, A., et al., "Dual-gate (FinFET) and tri-gate MOSFETs: simulation and design", Semiconductor Device Research Symposium, 2003 International, Dec. 10-12, 2003, pp. 150-151.
Buchanan, D. A., et al., "Fabrication of Midgap Metal Gates Compatible with Ultrathin Dielectrics," Applied Physics Letters, 73.12, (Sep. 21, 1998), pp. 1676-1678.
Burenkov, A. et al., "Corner Effect in Double and Triple Gate FINFETs", European Solid-State Device Research, 2003 33rd Conference on Essderc '03 Sep. 2003, Piscataway, NJ, USA, IEEE, pp. 135-138, XP010676716.
Chang, L., et al., "CMOS Circuit Performance Enhancement by Surface Orientation Optimization," IEEE Transactions on Electron Devices, IEEE Service Center, Piscataway, NJ, vol. 51, No. 10, Oct. 2004, pp. 1621-1627 XP001211140.
Chang, S.T. et al, "3-D Simulation of Strained Si/SiGe Heterojunction FinFETS", Semiconductor Device Research Symposium, 2003 International, Dec. 2003, Piscataway, NJ, USA, IEEE, pp. 176-177, XP010687197.
Chau, R., "Advanced Metal Gate/High-K Dielectric Stacks for High-Performance CMOS Transistors", Proceedings of AVS 5th International Conference of Microelectronics and Interfaces, Mar. 2004, (3 pgs.).
Chau, Robert et al., Advanced Depleted-Substrate Transistors: Single-gate, Double-gate and Tri-gate (Invited Paper), Components Research, Logic Technology Development, Intel Corporation, Hillsboro, OR, 2 pages.
Choi, Yang-Kyu et al., "A Spacer Patterning Technology for Nanoscale CMOS," IEEE Transactions on Electron Devices, vol. 49, No. 3, Mar. 2002, pp. 436-441.
Choi, Yang-Kyu et al., "Sub-20nm CMOS FinFET Technologies", Department of Electrical Engineering and Computer Sciences, University of California, Berkeley, CA 94720, USA, email: ykchoi@eecs.berkeley.edu, Tel: +1-510-643-2558, pp. 19.1.1-19.1.4.
Claflin, B., et al., "Interface Studies of Tungsten Nitride and Titanium Nitride Composite Metal Gate Electrodes with Thin Dielectric Layers," Journal of Vacuum Science and Technology A 16.3, (May/Jun. 1998), pp. 1757-1761.
Collaert, N. et al. "A Functional 41-Stage ring oscillator using scaled FinFET devices with 25-nm gate lengths and 10-nm fin widths applicable for the 45-nm CMOS node" IEEE Electron Device Letters, vol. 254, No. 8 (Aug. 2004), pp. 568-570.
Fried, David M. et al., "High-Performance P-Type Independent-Gate FinFETs," IEEE Electron Device Letters, vol. 25, No. 4, Apr. 2004, pp. 199-201.
Fried, David M. et al., "Improved Independent Gate N-Type FinFET Fabrication and Characterization", IEEE Electron Device Letters, vol. 24, No. 9, Sep. 2003, pp. 592-594.
Guo, Jing et al., "Performance Projections for Ballistic Carbon Nanotube Field-Effect Transistors," Applied Physics Letters, vol. 80, No. 17, Apr. 29, 2002, pp. 2192-2194.
Hisamoto et al., "A Folded-channel MOSFET for Deep-sub-tenth Micron Era", 1998 IEEE International Electron Device Meeting Technical Digest, pp. 1032-1034 (1998).
Hisamoto et al., "A Fully Depleted Lean-Channel Transistor (DELTA—A Novel Vertical Ultrathin SOI MOSFET", IEEE Electron Device Letters, V. 11(1), pp. 36-38 (1990).
Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.
Huang et al., "Sub 50-nm FinFET: PMOS", 1999 IEEE International Electron Device Meeting Technical Digest, pp. 67-70 (1999).
Hwang, Jeong-Mo et al., "Novel Polysilicon/Tin Stacked-Gate Structure for Fully-Depleted SOI/CMOS," International Electronic Devices Meeting Technical Digest, (1992), pp. 345-348.
Ieong, M. et al., Three Dimensional CMOS Devices and Integrated Circuits, IEEE 2003 CICC, San Jose, CA, Sep. 21-24, 2003, pp. 207-214.
Javey, Ali et al., "Ballistic Carbon Nanotube Field-Effect Transistors", Nature, vol. 424, Aug. 7, 2003, pp. 654-657.
Javey, Ali et al., "High-K Dielectrics for Advanced Carbon-Nanotube Transistors and Logic Gates", Advance Online Publication, Published online, Nov. 17, 2002 pp. 1-6.
Jin, B. et al., "Mobility Enhancement in Compressively Strained SIGE Surface Channel PMOS Transistors with HF02/TIN Gate Stack", Proceedings of the First Joint International Symposium, 206th Meeting of Electrochemical Society, Oct. 2004, pp. 111-122.
Jones, E. C., "Doping Challenges in Exploratory Devices for High Performance Logic", 14th Int'l. Conference, Piscataway, NJ, Sep. 22-27, 2002, pp. 1-6.
Kim, Sung Min, et al., A Novel Multi-Channel Field Effect Transistor (McFET) on Bulk Si for High Performance Sub-80nm Application, IEDM 04-639, 2004 IEEE, pp. 27.4.1-27.4.4.
Kuo, Charles et al. "A Capacitorless Double Gate DRAM Technology for Sub-100-nm Embedded and Stand-Alone Memory Applications," IEEE Transactions on Electron Devices, vol. 50, No. 12, Dec. 2003, pp. 2408-2416.
Kuo, Charles et al., "A Capacitorless Double-Gate DRAM Cell Design for High Density Applications", 2002 IEEE International Electron Devices Meeting Technical Digest, Dec. 2002, pp. 843-846.
Kuo, Charles et al., "A Hypothetical Construction of the Double Gate Floating Body Cell", 2002 IEEE International Electron Devices Meeting Technical Digest, Dec. 2002.
Lide, David R. "Properties of Semiconductors" CRC Handbook of Chemistry and Physics, internet version 2007, (87th edition), David R. Lide—Editor; Taylor and Francis, pp. 12-77-12-89.
Ludwig et al., "FinFET Technology for Future Microprocessors" 2003 IEEE, pp. 33-34 (from P16682PCT).
Martel, Richard et al., "Carbon Nanotube Field Effect Transistors for Logic Applications" IBM, T.J. Watson Research Center, 2001 IEEE, IEDM 01, pp. 159-162.
Mayer, T.M., et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

Nackaerts et al., "A 0.314µm² 6T-SRAM Cell build with Tall Triple-Gate Devices for 45nm node applications using 0.75NA 193nm lithography," IDEM, (2004), pp. 269-272.

Nowak, E. J., et al., "A Functional FinFET-DGCMOS SRAM Cell", Int'l. Electron Devices.Meeting 2002, San Francisco, CA, Dec. 8-11, 2002, pp. 411-414.

Nowak, E. J., et al., "Scaling Beyond the 65 nm Node with FinFET-DGCMOS", IEEE 2003 CICC, San Jose, CA, Sep. 21-24, 2003, pp. 339-342.

Nowak, Edward J. et al., "Turning Silicon on Its Edge," IEEE Circuits & Devices Magazine, vol. 1, (Jan./Feb. 2004), pp. 20-31.

Ohsawa, Takashi et al., "Memory Design Using a One-Transistor Gain Cell on SOI", IEEE Journal of Solid-State Circuits, vol. 37, No. 11, Nov. 2002, pp. 1510-1522.

Park, Donggun et al., "3-Dimensional nano-CMOS Transistors to Overcome Scaling Limits," IEEE 2004, IABN 0-7803-8511-X, (2004), pp. 35-40.

Park, Jae-Hyoun et al., "Quantum-wired MOSFET Photodetector Fabricated by Conventional Photolithography on SOI Substrate," Nanotechnology, 2004, 4th IEEE Conference on, Munich, Germany, Aug. 16-19, 2004, Piscataway, NJ, pp. 425-427, XP010767302.

Park, Jong-Tae, et al., "Pi-Gate SOI MOSFET". IEEE Electron Device Letters, vol. 22, No.8, Aug. 2001, pp. 405-406.

Park, T. et al., "PMOS Body-Tied FinFET (Omega MOSFET) Characteristics", Device Research Conference, Piscataway, NJ, Jun. 23-25, 2003, IEEE Jun. 2003, pp. 33-34.

Park, T. et al., "Fabrication of Body-Tied FinFETs (Omega MOSFETs) Using Bulk Si Wafers", 2003 Symposia on VLSI Technology Digest of Technical Papers, Jun. 2003, pp. 135-136.

Seevinck, Evert et al., "Static-Noise Margin Analysis of MOS SRAM Cells" 1987 IEEE, IEEE Journal of Solid-State Circuits, vol. SC-22, No. 5, Oct. 1987.

Stadele et al., "A Comprehensive Study of Corner Effects in Tri-gate Transistors," IEEE 2004, pp. 165-168.

Stolk, Peter A. et al., "Modeling Statistical Dopant Fluctuations in MOS Transistors", 1998 IEEE, IEEE Transactions on Electron Devices, vol. 45, No. 9, Sep. 1998, pp. 1960-1971.

Subramanian, V., et al., " A Bulk-Si-Compatible Ultrathin-body SOI Technology for sub-100nm MOSFETs" Proceeding of the 57th Annual Device Research Conference, pp. 28-29 (1999).

Sugizaki, T. et al., "Novel Multi-bit SONOS Type Flash Memory Using a High-k Charge Trapping Layer," VLSI Technology, 2003, Digest of Technical Papers, Symposium on, Jun. 10-12, 2003, (2003), pp. 27-28.

Tanaka, T. et al., Scalability Study on a Capacitorless 1T-DRAM: From Single-gate PD-SOI to Double-Gate FinDRAM, 2004 IEEE International Electron Devices Meeting Technical Digest, Dec. 2004, (4 pages).

Tang, Stephen H. et al., "FinFET—A quasi-planar double-gate MOSFET", 2001 IEEE International Solid-State Circuits Conference (Feb. 6, 2001), pp. 1-3.

Tokoro, Kenji et al., "Anisotropic Etching Properties of Silicon in KOH and T MAH Solutions," International Symposium on Micromechatronics and Human Science, IEEE (1998), pp. 65-70.

Wolf, Stanley et al., "Wet Etching Silicon," Silicon Processing for the VLSI Era, vol. 1: Process Technology, Lattice Press, Sunset Beach, CA, (Sep. 1986), (3 pages).

Xiong, W., et al., "Corner Effect in Multiple-Gate SOI MOSFETs" 2003 IEEE, pp. 111-113.

Xiong, Weize et al., "Improvement of FinFET Electrical Characteristics by Hydrogen Annealing," IEEE Electron Device Letters, vol. 25, No. 8, Aug. 2004, XP-001198998, pp. 541-543.

Yang, Fu-Liang et al., "25nm CMOS Omega FETs" IEEE 2002, 10.3.1-10-.3.4, pp. 255-258.

Yang, Fu-Liang, et al., "5nm-Gate Nanowire FinFET," 2004 Symposium on VLSI Technology Digest of Technical Papers, 2004 IEEE, pp. 196-197.

PCT "International Preliminary Report on Patentability" , PCT/US/2006/037634, mailed Apr. 10, 2008, 12 pp.

Taiwan IPO Search Report for Application No. TW 094136197, mailed May 15, 2008, 4 pgs. (No translation. However, the 4$^{th}$ page clearly shows all art cited).

Austrian Patent Office, Written Opinion for Singapore Patent Application No. 200604766-6 (Apr. 4, 2008, 4 pp. NOTE: Formerly listed as IPOS, "Examiner's Written Opinion", Singapore Patent Application No. 200604766-6 (Apr. 4, 2008) pp. 1-5. (First page was letter from FA in Singapore.

International Search Report for PCT/US2003/026242, mailed Jan. 26, 2004, 8 pgs.

International Search Report for PCT/US2003/039727, mailed Apr. 24, 2004, 6 pgs.

International Search Report for PCT/US2003/040320, mailed Jun. 2, 2004, 7 pgs.

International Search Report for PCT/US2005/000947, mailed May 3, 2005, 7 pgs.

International Search Report and Written Opinion for PCT/US2005/010505, mailed Aug. 26, 2005, 24 pgs.

International Search Report and Written Opinion for PCT/US2005/020339, mailed Oct. 4, 2005, 20 pgs.

International Search Report for PCT/US2005/033439, mailed Jan. 31, 2006, 7 pgs.

International Search Report and Written Opinion for PCT/US2005/035380, mailed Feb. 13, 2006, 14 pgs.

International Search Report and Written Opinion for PCT/US2004/032442, mailed Jun. 16, 2005, 22 pgs.

International Search Report and Written Opinion for PCT/US2005/037169, mailed Feb. 23, 2006, 11 pgs.

International Search Report and Written Opinion for PCT/US2006/000378, mailed May 24, 2006, 11 pgs.

International Search Report and Written Opinion for PCT/US2006/024516, mailed Jan. 17, 2007, 18 pgs.

International Search Report for PCT/US2006/037643, mailed Jan. 24, 2007, 4 pgs.

IPER and Written Opinion for PCT/US2005/037169, mailed May 10, 2007, 7pgs. added to Master list Jan. 6, 2010.

Office Communication mailed Jan. 25, 2006, U.S. Appl. No. 10/955,670.

Office Communication mailed Oct. 31, 2007, U.S. Appl. No. 11/335,103.

Office Communication mailed May 23, 2008, U.S. Appl. No. 11/335,103.

Office Communication mailed Oct. 27, 2008, U.S. Appl. No. 11/335,103.

Office Communication mailed Nov. 14, 2008, U.S. Appl. No. 11/335,103.

Office Communication mailed May 28, 2009, U.S. Appl. No. 11/335,103.

Office Communication mailed Nov. 13, 2009, U.S. Appl. No. 11/335,103.

Office Communication mailed May 26, 2010, U.S. Appl. No. 11/335,103.

* cited by examiner

FIG. 10

INDEPENDENTLY ACCESSED DOUBLE-GATE AND TRI-GATE TRANSISTORS

RELATED APPLICATIONS

This is a Continuation of application Ser. No. 12/852,408 filed Aug. 6, 2010 now U.S. Pat. No. 8,268,709 and which is a Continuation of application Ser. No. 11/335,103, filed Jan. 18, 2006 now U.S. Pat. No. 7,859,053 which is a Divisional of application Ser. No. 11/124,572 filed May 4, 2005 now U.S. Pat. No. 7,037,790 which is a Continuation-in Part of application Ser. No. 10/955,670 filed Sep. 29, 2004 now U.S. Pat. No. 7,422,946.

FIELD OF THE INVENTION

The invention relates to the field of semiconductor processing.

BACKGROUND OF THE INVENTION

Independently-controlled double-gate (I-gate) transistors are a relatively recent development in semiconductor processing. They have two gates disposed on opposite sides of a channel, each gate capable of being independently controlled. This provides added transistor flexibility and enables, for example, using a single body to form a dynamic random-access memory (DRAM) cell. Tri-gate transistors are another relatively recent development in semiconductor processing. With tri-gate transistors, the gate forms adjacent three sides of a channel region. Tri-gate transistors, particularly when used with a high-k insulator and metal gate, can substantially improve the speed and performance of integrated circuits.

A number of I-gate structures have been proposed. This and other related technology is described at C. Kuo, *IEDM*, December 2002, following M. Chan Electron Device Letters, January 1994; C. Kuo, *IEDM*, December 2002, "A Hypothetical Construction of the Double Gate Floating Body Cell;" T. Ohsawa, et al., *IEEE Journal of Solid-State Circuits*, Vol. 37, No. 11, November 2002; David M. Fried, et al., "High-Performance P-Type Independent-Gate FinFETs," *IEEE Electron Device Letters*, Vol. 25, No. 4, April 2004; and David M. Fried, et al., "Improved Independent Gate N-Type FinFET Fabrication and Characterization," *IEEE Electron Device Letters*, Vol. 24, No. 9, September 2003. Tri-gate structures are described at, for instance, publication number U.S. 2004-0036127-A1.

DETAILED DESCRIPTION

In the following description, the fabricating of an independently accessed, double-gate (I-gate) transistor and a tri-gate transistor on a common substrate is described. Numerous specific details are set forth, such as specific materials, in order to provide a thorough understanding of the present invention. It will be apparent to one skilled in the art, that the present invention may be practiced without these specific details. In other instances, well known processing steps have not been described in detail, in order not to unnecessarily obscure the present invention. For example, well-known cleaning steps, and some protective layers often used in the fabrication of integrated circuits, are not described.

The method which follows describes the formation of both the I-gate transistor and a tri-gate transistor in a single process flow. While the fabrication of only a single I-gate transistor and a single tri-gate transistor are illustrated, it will be apparent to one skilled in the art, that in a typical integrated circuit, numerous such transistors are simultaneously fabricated. Moreover, the I-gate and tri-gate transistors may be fabricated wherever needed in the integrated circuit. Thus, a single circuit, such as a buffer, may have both I-gate and tri-gate transistors. In some cases, for example in a DRAM, an array of memory cells using only I-gate transistors may be fabricated and connected to peripheral circuits which use both I-gate and tri-gate transistors. A memory using I-gate memory cells is described in "Memory with Split-Gate Devices and Method of Fabrication," Ser. No. 10/816,282, filed Mar. 31, 2004, and assigned to the assignee of the present application.

Figure 1A:
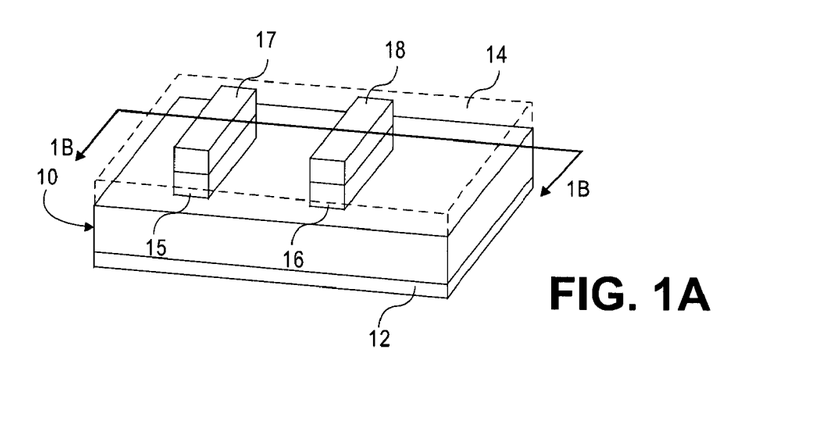
FIG. 1A is a perspective view of a substrate which includes two silicon bodies with overlying insulative members
Figure 1B:
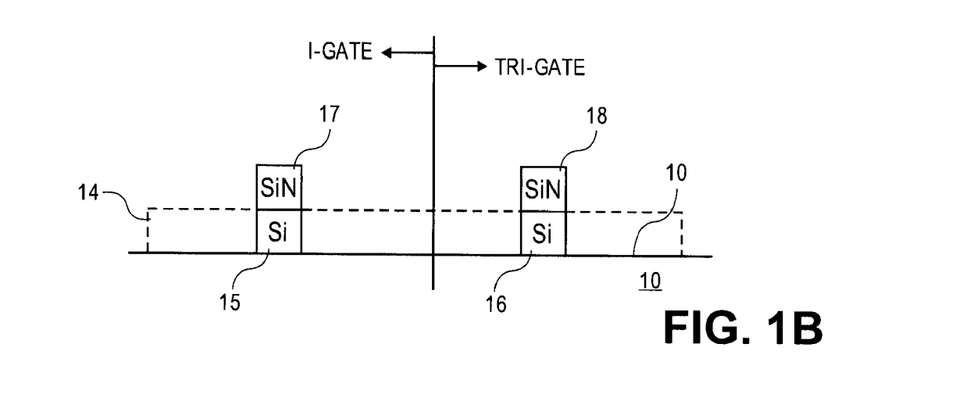
FIG. 1B is a cross-sectional view of the structure of FIG. 1 taken through section line 1B-1B of FIG. 1A.

In one embodiment, the transistors are fabricated on an oxide layer 10 which is formed on a semiconductor substrate, for example a silicon substrate 12. The transistor bodies are fabricated from a monocrystalline silicon layer 14 (shown in dotted lines in FIGS. 1A and 1B) disposed on layer 10. This silicon-on-insulator (SOI) substrate is well-known in the semiconductor industry, where as shown, the layer 14 is disposed on the layer 10. By way of example, the SOI substrate is fabricated by bonding the oxide layer 10 and a silicon layer 14 onto the substrate 12, and then, planarizing the layer 14 so that it is relatively thin. This relatively thin, low body effect layer, is used to form the bodies of active devices, as mentioned. Other techniques are known for forming an SOI substrate including, for instance, the implantation of oxygen into a silicon substrate to form a buried oxide layer. In the subsequent cross-sectional views, the transistors are shown fabricated on the oxide layer 10, the underlying silicon substrate 12 is not shown.

The layer 14 may be selectively ion-implanted with an n-type dopant in the regions where n channel devices are to be fabricated, and with a p type dopant in those regions where p channel devices are to be fabricated. This is used to provide the relatively light doping typically found in the channel regions of MOS devices fabricated in a CMOS integrated circuit. Both the I-gate and tri-gate transistors may be fabricated with the described process as either p channel or n channel devices. (The doping of the channel regions of the transistors may be done at other points in the process flow such as the point in the process shown in FIG. 1A or 7A.)

In the processing for one embodiment, a protective oxide (not shown) is disposed on the silicon layer 14 followed by the deposition of a silicon nitride layer. The nitride layer is masked to define a plurality of insulative members, such as members 17 and 18 of FIGS. 1A and 1B. Then, the underlying silicon layer 14 is etched in alignment with these members resulting in the silicon bodies 15 and 16.

The width of the silicon bodies 15 and 16 may be the critical dimension in a particular process, for instance, in a 30 nanometer (nm) gate length process, these bodies may have a width of 30 nm. The thickness of the layer 14, and the silicon nitride layer from which the members 17 and 18 are formed, may each be, by way of example, in the range of 10-100 nm.

Figure 2A:
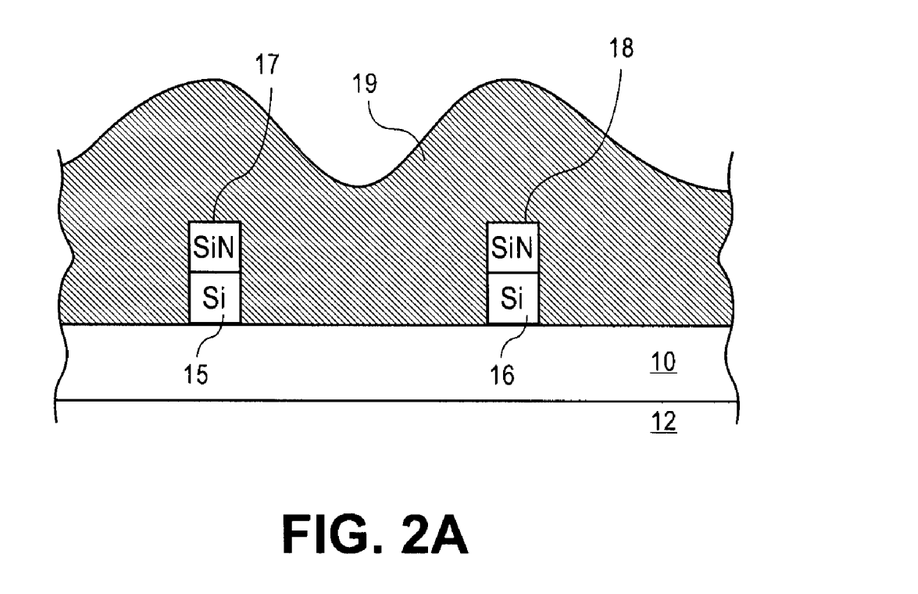
FIG. 2A illustrates the structure of FIG. 1 following deposition of a sacrificial layer.

Next as shown in FIG. 2A, a sacrificial layer 19 is deposited over the stacks (i.e. the insulative members/silicon bodies 17/15 and 18/16) and on the oxide layer 10. In one embodiment, this layer is a polysilicon layer 50-200 nm thick. However, other materials may be used for the sacrificial layer 19. The material used for the sacrificial layer 19 should be able to protect the channel regions of the devices from ion implantation during the formation of the source and drain regions, as will be described. And, the sacrificial layer should be selectively removable so as not to significantly impact the integrity of an ILD formed around the sacrificial layer after patterning to form sacrificial gate members, as will be described. Additionally, the insulative members, such as for example member 18 should be able to be selectively removed in the presence of the sacrificial layer, so as to facilitate formation of the fri-gate transistor.

In accordance with one embodiment, unlike conventional methods, the sacrificial layer 19 is planarized prior to patterning and etching the sacrificial gate-defining members. To the extent that the sacrificial layer 19 is not planar, gate patterning issues, such as those discussed with respect to FIG. 10, can be encountered.

Figure 10:
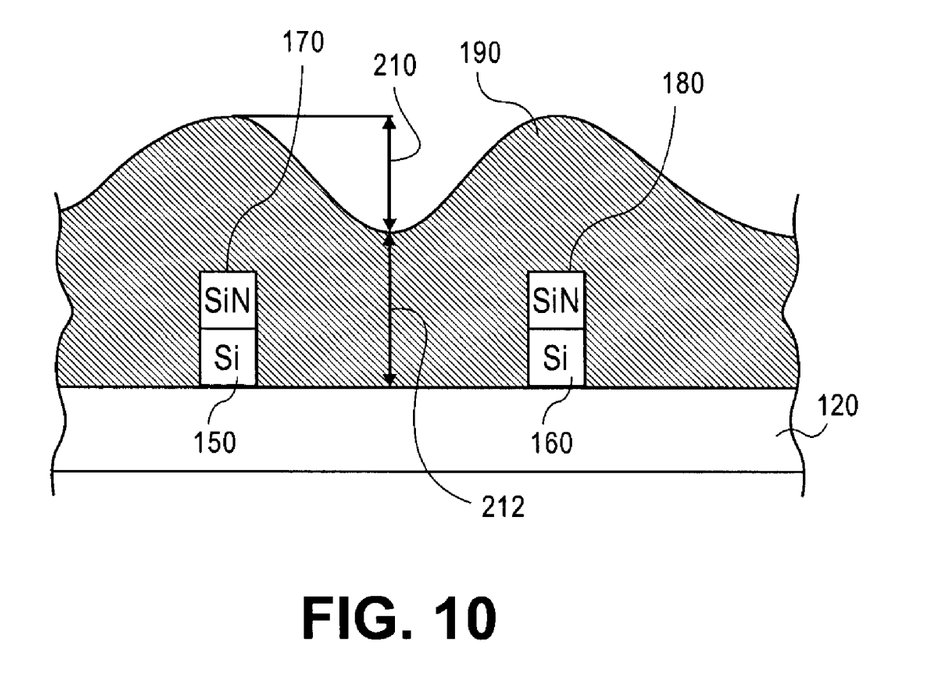
FIG. 10 is a cross-sectional view showing topography variations that can be encountered when forming gate-defining members using conventional processing.

As shown in FIG. 10, after the silicon nitride (SiN) layer and underlying silicon layer are patterned and etched to the form stacks that include insulative members/silicon bodies 170/150 and 180/160 (similar to stacks 17/15 and 18/16 in FIGS. 1A and 1B), a sacrificial layer 190, such as a sacrificial polysilicon layer, is deposited over the stacks. The sacrificial layer 190 is deposited so that it completely covers the stacks. The sacrificial layer 190 is subsequently patterned and etched to form sacrificial gate-defining members. The gate-defining members temporarily occupy regions where gates for the I-gate and tri-gate transistors are eventually formed. The gate-defining members can also be used to facilitate selective removal the insulative member 180 during formation of the tri-gate transistor.

However, as shown in FIG. 10, forming the sacrificial layer so that it completely covers the stacks can result in the formation of large topography non-uniformities 210. These non-uniformities can create difficulties when patterning resist features that define the sacrificial gate-defining members. In addition, as one of ordinary skill can appreciate, because the degree of the non-uniformity 210 depends on the distance between underlying features and the thickness of the sacrificial layer (i.e., underlying features that are in closer to each other can have less topography associated with them than features that are spaced farther apart), variations can exist in the thickness 212 of the sacrificial layer. These thickness variations can affect the quality of the etch process used to define the gate-defining members and result in underetch in some regions and overetch in other regions. To the extent that the topography impacts photolithography and/or causes underetch or overetch of the sacrificial polysilicon layer, it can result in the manifestation of defects in the permanent gate structures. These defects can thereby impact the yield, functionality, and reliability of resulting transistors.

Figure 2B:
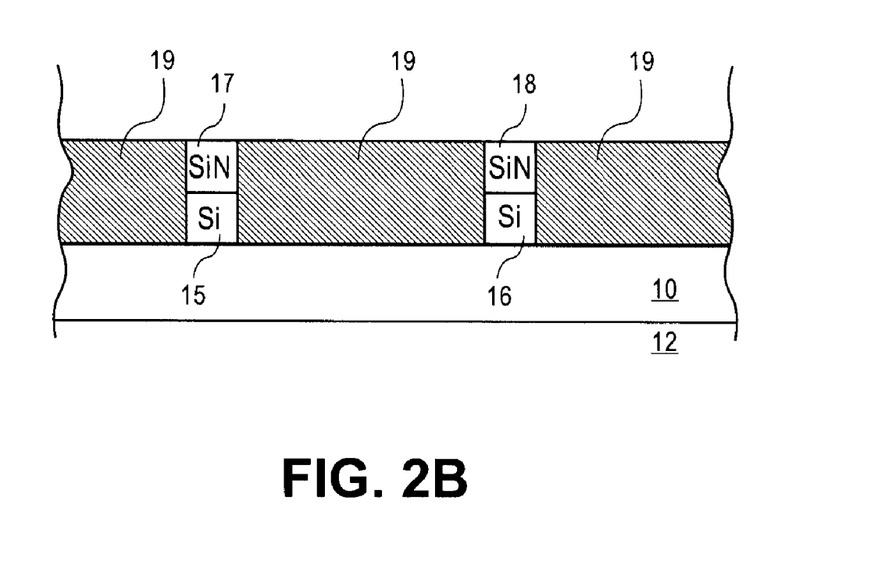
FIG. 2B illustrates the structure of FIG. 2A following planarization of the sacrificial layer.

One embodiment of the present invention overcomes these limitations by first planarizing the sacrificial polysilicon layer, and thereby eliminating the topography and its associated variations, prior to patterning, etching, and forming the sacrificial gate-defining members. More specifically after depositing the sacrificial layer 19, as shown in FIG. 2A. The sacrificial layer 19 is planarized as shown in FIG. 2B. Planarization can be accomplished using a conventional chemical mechanical polishing (CMP) process, a reactive ion etch process, or the like. In embodiments where a CMP process is used, the CMP process can be a timed polish or the insulative members 17 and 18 can function as polish stops whereupon exposure of the upper surfaces of the insulative members 17 and 18, the CMP system responds by terminating the polishing process immediately, terminating after a predetermined time, or terminating after performing an overpolish processing step. While the cross-sectional view shown in FIG. 2B shows that the planarization process produces surfaces of the sacrificial polysilicon layer 19 and insulative members 17/18 that are co-planar, one of ordinary skill appreciates that the polish or etch back process could alternatively terminate at some point prior to exposing the insulating members 17 and 18. Following planarization, the planarized sacrificial layer now has a more planar topography as compared to the conventional process, thereby facilitating the patterning and etching of the gate-defining members. In addition the resulting etched features will have reduced aspect ratios, as compared to conventionally used process flows, thereby facilitating improved step coverage of subsequently deposited films.

Figure 2C:
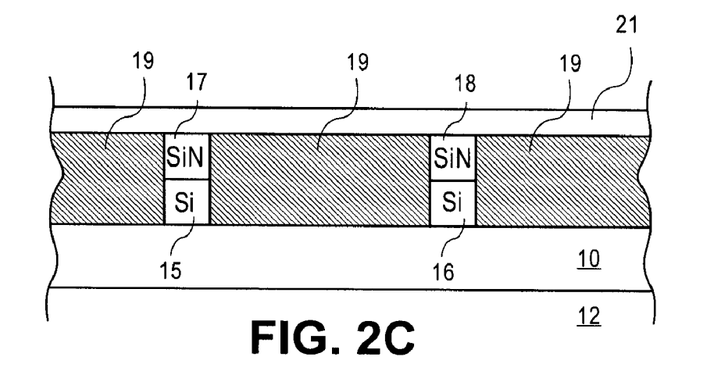
FIG. 2C illustrates the structure of FIG. 2B following deposition of a hardmask layer over the planarized sacrificial layer.

As shown in FIG. 2C, an optional hardmask layer 21 can now be formed over the planarized sacrificial layer 19. In one embodiment, the hardmask layer is a silicon oxynitride layer. Alternatively, the hardmask layer can include other materials such as silicon nitride, silicon-rich-silicon-nitride, or the like. The hardmask layer provides a uniform surface onto which the resist can be patterned, i.e., instead of the exposed surface area including areas of SiN (insulative members 17 and 18) and areas of polysilicon (sacrificial layer 19), the hardmask provides a single surface (e.g., oxide) onto which the resist is patterned. This can reduce resist adhesion problems. In addition, it functions as a protective masking layer during subsequent etch processes to define the gate-defining members and thereby allows the use of thinner resists so that increasingly smaller feature sizes can be patterned. Therefore, the hardmask layer should have a thickness that sufficiently protects the sacrificial layer during the subsequent etch process to define the gate-defining members.

Next, the sacrificial and hardmask layers are patterned and etched. As a result, remaining portions of the sacrificial layer 19 thereby form gate-defining members shown as members 20 and 22 in FIGS. 2D and 2E. The member 20 occupies the region in which the two gates for the I-gate transistor is fabricated as well as areas where contact and/or via connections can be made. The member 22 occupies the region in which the tri-gate is formed for the tri-gate transistor, as well as an area, again for contacts and/or vias. Because the sacrificial layer 19 is now thinner than it otherwise would be using conventional methods and because its topography has much less variation associated with it, the sacrificial layer etch to form the gate-defining members is less prone to problems with underetch and overetch. This not only reduces the occurrence of overetch and underetch related defects, it can also reduce cycle time and improve the overall manufacturability of the sacrificial layer etch process.

Figure 2D:
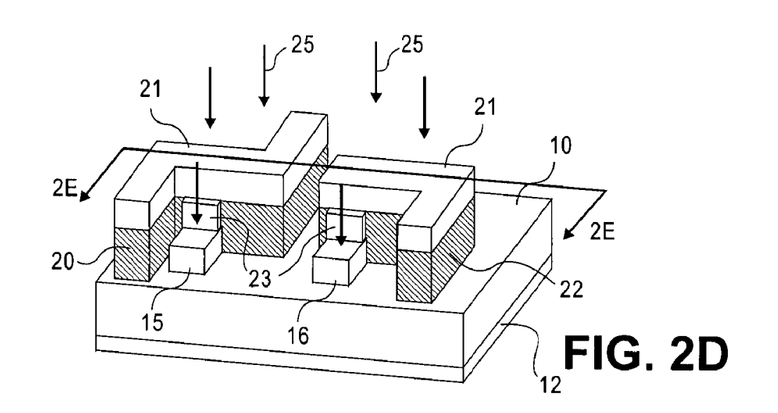
FIG. 2D illustrates a perspective view of the structure of FIG. 1 following the patterning of the hardmask and sacrificial layers.
Figure 2E:
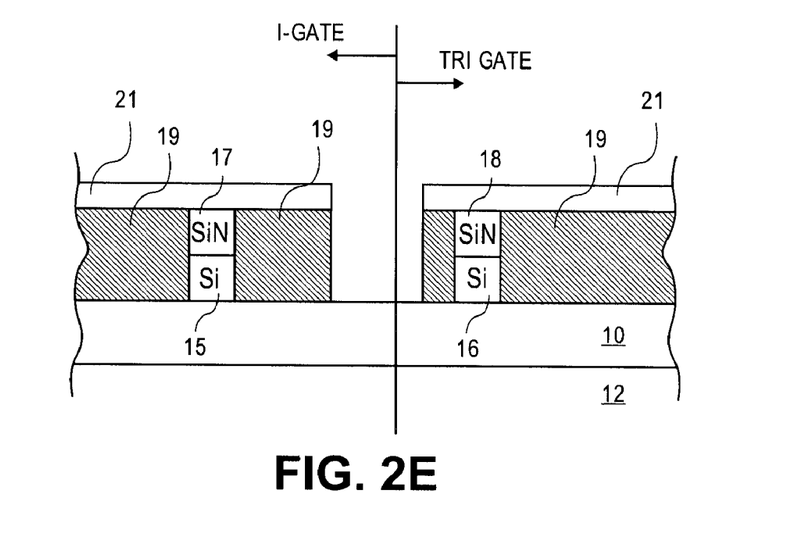
FIG. 2E is a cross-sectional view of the structure of FIG. 2D taken through section line 2E-2E of FIG. 2D.

Also, as shown in FIG. 2D, at this point in the process, portions of the insulative members 17 and 18 not covered by the gate-defining members 20 and 22 may be etched, thereby exposing portions of the underlying silicon bodies 15 and 16. Then, as shown by the arrows 25, the silicon bodies 15 and 16, to the extent they are not covered by the members 20 and 22, can be ion implanted to form source and drain regions for both the I-gate and tri-gate transistors. As is commonly done, but not shown, separate ion implantation steps are used for the p channel and n channel devices, with protective layers or masking layer being used to permit separate implantation of the source and drains for the p channel and n channel devices.

Additionally, spacers 23 may be formed to allow a more lightly doped source and drain region to be implanted adjacent the channel region, and more heavily doped source and drain regions spaced apart from the channel region. This is described in the above-referenced application Ser. No. 10/816,282.

Figure 3:
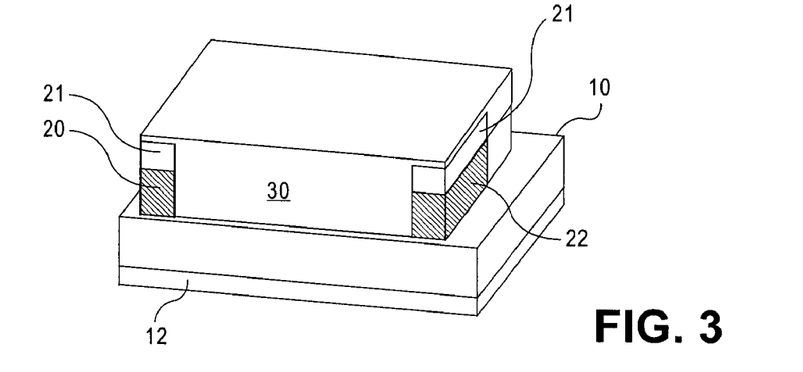
FIG. 3 is a perspective view of the structure of FIG. 2D following the deposition of an interlayer dielectric (ILD).

Turning now to FIG. 3, an ILD 30 is now formed over the insulative layer 10, gate-defining members 20 and 22, and silicon bodies 15 and 16. The ILD 30 is formed adjacent the sides of the members 20 and 22, and as will be seen, is used to form a trench that allows the inlay of metal once the gate-defining members are removed. The ILD 30 may be, for instance, a chemical vapor deposited (CVD) silicon dioxide layer.

The ILD 30 is then planarized, for instance, using a CMP process, so as to remove portions of the ILD 30 and portions of the hardmask 21 overlying insulative members 17 and 18, thereby exposing the upper surfaces of the insulative members 17 and 18. This is illustrated in both FIGS. 4A and 4B. Note, the upper surfaces of members 17 and 18 are flush with the upper surface of the ILD 30 and the upper surfaces of the members 20 and 22.

Figure 4A:
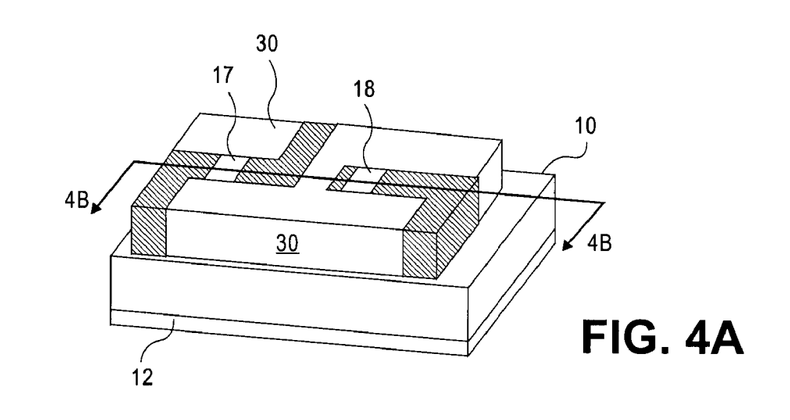
FIG. 4A is a perspective view of the structure of FIG. 3 following planarization of the ILD to a point where it exposes remaining portions of the insulative members 17 and 18.
Figure 4B:
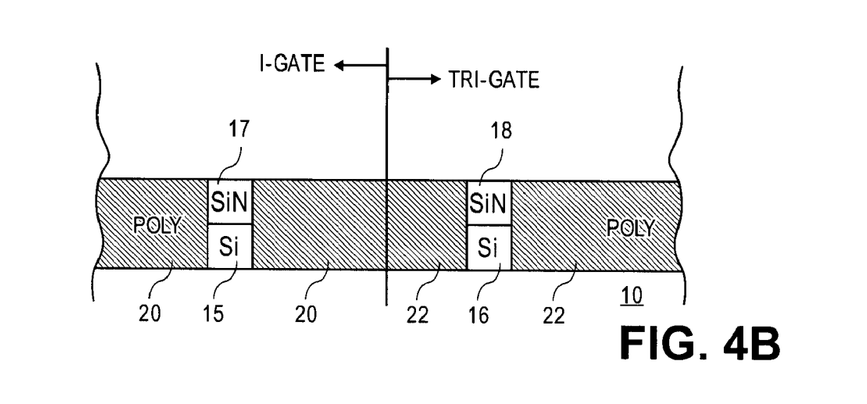
FIG. 4B is a cross-sectional view taken through section line 4B-4B of FIG. 4A.
Figure 5:
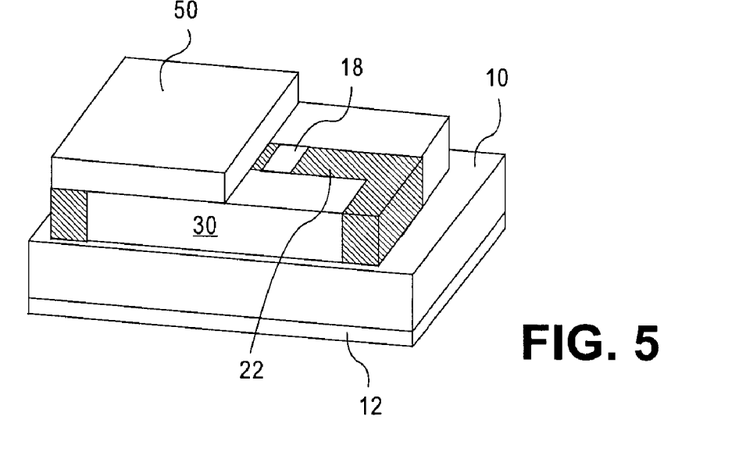
FIG. 5 is a perspective view of the structure of FIG. 4 following the covering of a section of the substrate on which an I-gate transistor is fabricated.

Now, a masking layer (photoresist mask layer and/or an oxide hardmask layer) is deposited over the structure of FIGS. 4A and 4B, and patterned so as to remain in place over the I-gate transistor region. The masking layer 50 covers the insulative member 17. As shown in FIG. 5, the masking layer 50 leaves exposed insulative member 18 of the tri-gate device.

Figure 6A:
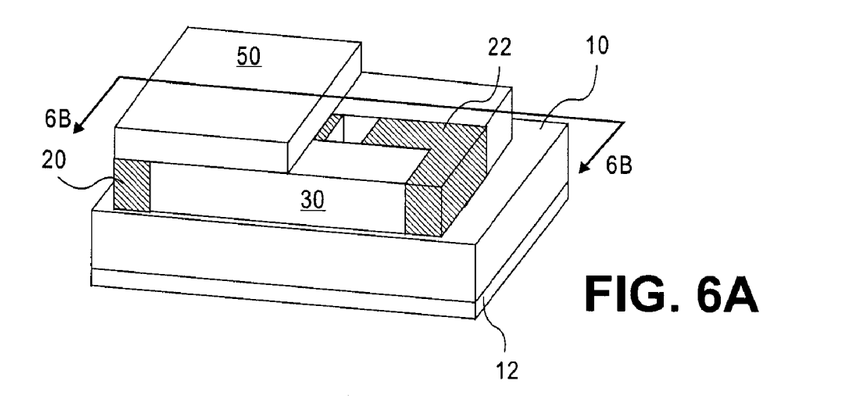
FIG. 6A is a perspective view of the structure of FIG. 5 following an etching step.
Figure 6B:
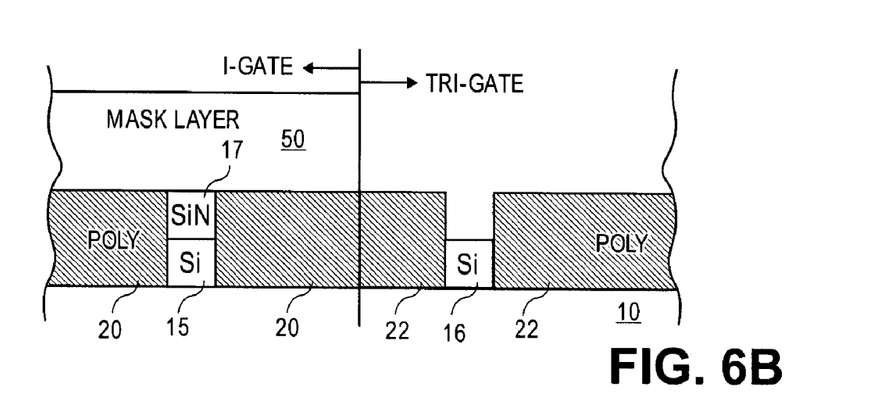
FIG. 6B is a cross-sectional view of the structure of FIG. 6A taken through section line 6B-6B of FIG. 6A.

Then, as shown in FIGS. 6A and 6B, an etching process is used to remove the plug-shaped silicon nitride member 18. An etchant that discriminates between the silicon nitride and both the ILD 30 and sacrificial layer is used so that the ILD 30 and member 22 remain substantially intact. A dry or wet etchant may be used. In one embodiment, a conventional hot phosphoric acid bath is used to remove the silicon nitride member 18. In this embodiment, it may be advantageous to use an oxide hardmask as the masking layer 50. Once the member 18 is removed, the underlying silicon body 16 as shown in FIG. 6B is exposed.

Figure 7A:
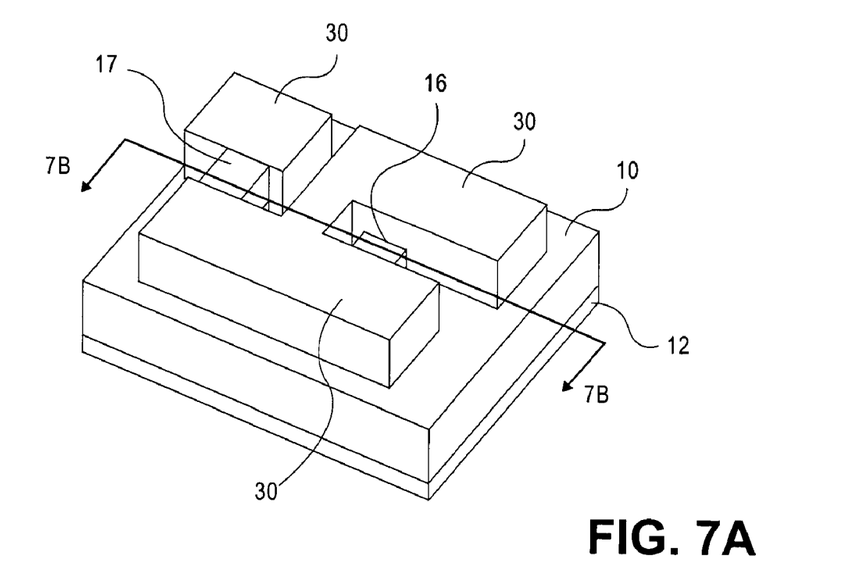
FIG. 7A is a perspective view of the structure of FIG. 6A following removal of the patterned, sacrificial layer and formation of trench opening in the ILD.
Figure 7B:
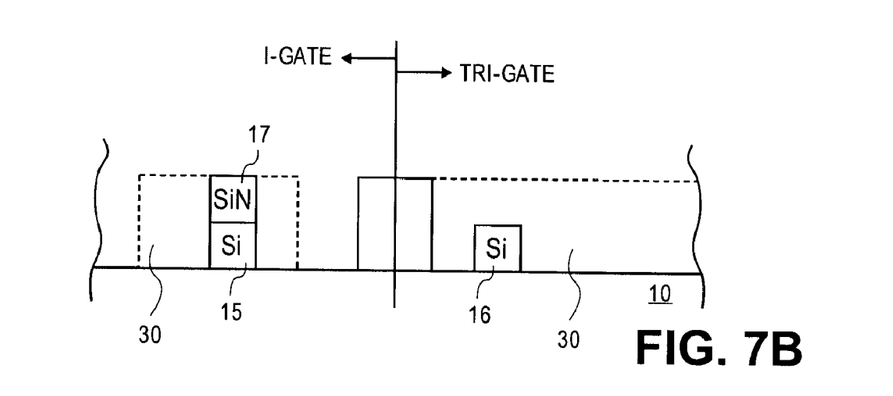
FIG. 7B is a cross-sectional view of the structure of FIG. 7A taken through section line 7B-7B of FIG. 7A.

The polysilicon sacrificial layer is next removed with, for example, a wet etch process. The resultant structure is shown in FIGS. 7A and 7B. The remaining ILD 30 now defines a trench formed in a pattern in which the gates for the transistors are to be fabricated.

Figure 8:
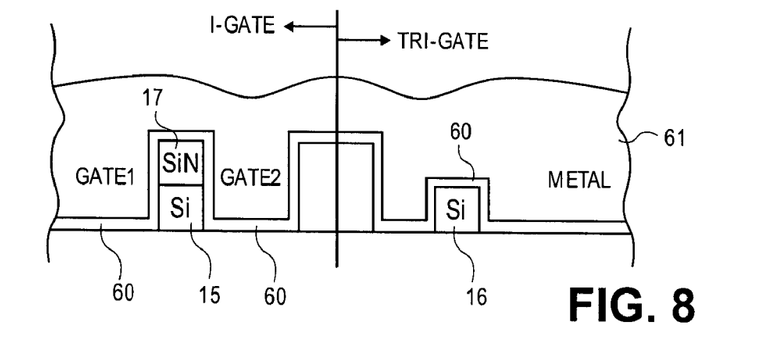
FIG. 8 is a cross-sectional view of the structure of FIG. 7B following the formation of an insulative layer and a gate layer in the trench opening.

A gate dielectric layer 60 is formed on and around each semiconductor bodies 15 and 16 as seen in FIG. 8. Specifically, a gate dielectric may be deposited such that it covers the top surface of the semiconductor body 16 and the insulative member 17 as well as on the opposite side-walls of each of the semiconductor bodies. This gate dielectric ideally has a high dielectric constant, such as a metal oxide dielectric, for instance, $HfO_2$ or ZrO or other high-k dielectrics, such as PZT or BST. A high-k dielectric film can be formed by any well-known technique such as by chemical vapor deposition (CVD), atomic layer deposition (ALD), or the like. Alternatively, the gate dielectric can be a grown dielectric. In one embodiment, the gate dielectric layer 60 is a silicon dioxide film grown with a dry/wet oxidation process. For example, the silicon dioxide film is grown to a thickness of between 5-50 Å. (A conformally deposited dielectric layer is shown in FIG. 8.)

Next, as shown in FIG. 8, a gate electrode (metal) layer 61 is formed over the gate dielectric layer 60. The gate electrode layer 61 may be formed by blanket deposition of a suitable gate electrode material. In one embodiment, a gate electrode material comprises a metal film such as Tungsten, Tantalum, Titanium and/or nitrides and alloys thereof. For the n channel, I-gate and tri-gate transistors, a work function in the range of 4.0 to 4.6 eV may be used. For the p channel, I-gate and tri-gate transistors, a work function of 4.6 to 5.2 eV may be used. Consequently, for substrates with both n channel and p channel transistors, two separate metal deposition processes may need to be used.

Figure 9A:
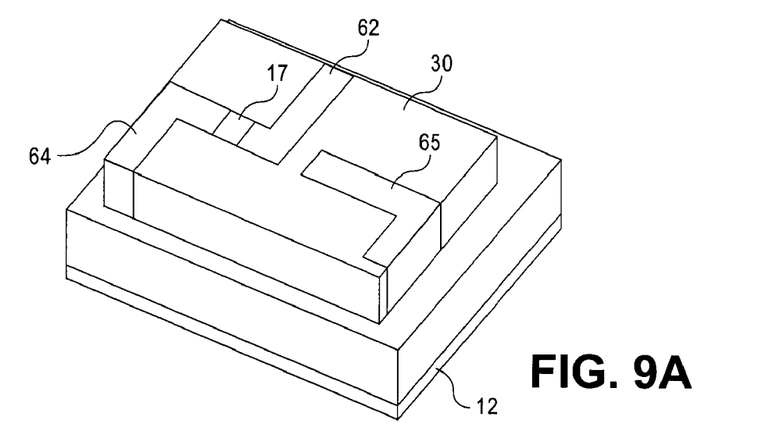
FIG. 9A is a perspective view of the structure of FIG. 8 following planarization of the gate layer.
Figure 9B:
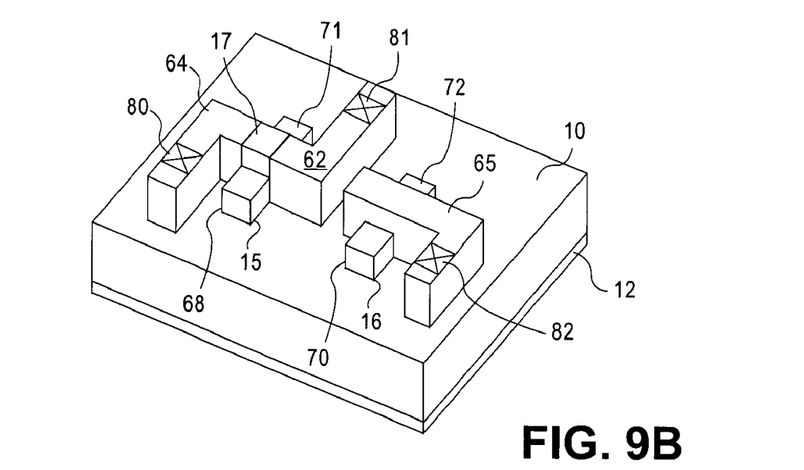
FIG. 9B is a perspective view of the structure of FIG. 9A with the ILD removed.

The metal layer 61 is planarized using, for example CMP, and such planarization continues until at least the upper surface of the insulative member 17 is exposed, as shown in FIGS. 9A and 9B. This is done in order to assure that no metal spans the member 17, since otherwise, the gates in the I-gate transistor will be shorted together. As can be seen in FIG. 9, there are two independent gates 62 and 64 for the I-gate transistor, and a single gate 65 for the tri-gate device.

The gate 65 for the tri-gate transistor has a top surface opposite the bottom surface and has a pair of laterally opposite sidewalls formed adjacent the tri-gate structure best seen in FIG. 9B. These sidewalls are connected on the upper surface of the silicon body. Thus, the gate surrounds the channel region of the tri-gate transistor on three sides. For the I-gate transistor, two independent gates 62 and 64 are separated by the insulative member 17, again best seen in FIG. 9B (where the ILD is shown removed).

Also, best seen in FIG. 9B, the silicon bodies 15 and 16 are shown on the insulative layer 10. Source regions 68 and 70 are shown for each of the transistors along with drain regions 71 and 72. The independent gates 62 and 64 along with their orthogonally disposed contact areas are readily seen. The same is true for the gate 65. These areas allow for easier contact to be made to the gates from overlying conductive structures, as shown by contact regions 80, 81 and 82. While not shown in FIG. 9B, contact can be made to the source and drain regions as well as to the gates from overlying metallization layers through contacts and or vias (not shown).

I-gate transistors may be used in logic circuits along with the tri-gate transistors. I-gate transistors have characteristics which make them desirable in certain circuits. For instance, a single I-gate transistor may provide both a high current and medium current device depending on the potential applied to one or both gates. Such devices may provide a "strong off" device to reduce leakage in a sleep mode or power-down mode. I-gate transistors also provide a device for pre-charge lines by allowing a trickle current. In the above-mentioned patent application, the I-gate devices can be used as DRAM cells, and the process described above, may be used in connection with such DRAM fabrication. In this case, the silicon body 15 is an elongated body formed in a plurality of parallel, spaced-apart lines and used in an array of DRAM cells.

While in the figures two separate silicon bodies are shown, it will be appreciated that a single body may be used. Then, a tri-gate and I-gate transistor may be fabricated in series with one another. In addition, one of ordinary skill appreciates that while in the foregoing discussion silicon is used as the semiconductor material to form the silicon bodies, the bodies can alternatively comprise other semiconductor materials in addition to or instead of silicon. Also, while embodiments of the present invention have been described in conjunction with the formation of transistors using an SOI substrate, one of ordinary skill appreciates that one or more of these embodiments can be incorporated into processes that form I-Gate/Tri-gate transistors in a bulk monocrystalline substrate, For example, dielectric material in trench isolation structures formed in a bulk monocrystalline silicon substrate can be recessed to form raised channel regions (similar to members 15 and 16 in FIG. 2A), and thereafter a sacrificial layer (similar to sacrificial layer 19 in FIG. 2A) can be deposited over the raised channel regions and planarized as shown in FIG. 2B. In this way, topography variations that can impact the patterning and etch processes that define sacrificial gate-defining members can be reduced.

Thus, a process has been described and a resultant structure for an integrated circuit having both an I-gate and tri-gate structure on a common substrate.

What is claimed is:

1. An integrated circuit comprising:
   a substrate;
   a tri-gate transistor on the substrate having a body surrounded on three sides by a first metal gate; and
   an independently accessed, double-gate transistor on the substrate having a body having two independent metal gates on opposite sides of the body.

2. The circuit defined by claim 1, wherein the body of the tri-gate transistor and the body of the independently accessed, double-gate transistor each comprise monocrystalline silicon.

3. The circuit defined by claim 2, including an insulating member disposed on the body of the independently accessed, double-gate transistor, between the independent metal gates.

4. The circuit defined by claim 3, wherein the insulating member comprises silicon nitride.

5. The circuit defined by claim 1, including a plurality of the trigate and the independently accessed, double-gate transistors, some of which are n channel transistors and others of which are p channel transistors.

6. The circuit defined by claim 5, wherein the bodies of the transistors comprise monocrystalline silicon.

\* \* \* \* \*